(12) United States Patent
Ayers

(10) Patent No.: US 7,531,209 B2
(45) Date of Patent: May 12, 2009

(54) POROUS FILMS AND BODIES WITH ENHANCED MECHANICAL STRENGTH

(76) Inventor: Michael Raymond Ayers, 808 Robinson St., Martinez, CA (US) 94553

( * ) Notice: Subject to any disclaimer, the term of this patent is extended or adjusted under 35 U.S.C. 154(b) by 296 days.

(21) Appl. No.: 10/906,534

(22) Filed: Feb. 24, 2005

(65) Prior Publication Data
US 2006/0185794 A1 Aug. 24, 2006

(51) Int. Cl.
*B05D 7/22* (2006.01)
(52) U.S. Cl. .................. 427/230; 427/243; 427/245; 977/754; 977/902
(58) Field of Classification Search ................. 427/230, 427/243, 245; 977/470, 754, 902
See application file for complete search history.

(56) References Cited

U.S. PATENT DOCUMENTS

| | | |
|---|---|---|
| 4,002,800 A | 1/1977 | Nestler et al. |
| 4,652,467 A | 3/1987 | Brinker et al. |
| 4,987,101 A | 1/1991 | Kaanta et al. |
| 5,103,288 A | 4/1992 | Sakamoto et al. |
| 5,294,732 A | 3/1994 | Chiang et al. |
| 5,308,481 A | 5/1994 | Stalling et al. |
| 5,338,571 A | 8/1994 | Mirkin et al. |
| 5,386,048 A | 1/1995 | West et al. |
| 5,416,188 A | 5/1995 | Chiang et al. |
| 5,420,081 A | 5/1995 | Mattes et al. |
| 5,470,820 A | 11/1995 | Hauser et al. |
| 5,494,859 A | 2/1996 | Kapoor |
| 5,698,140 A | 12/1997 | Lamb et al. |
| 5,739,376 A | 4/1998 | Bingel |
| 5,744,399 A | 4/1998 | Rostoker |
| 5,789,819 A | 8/1998 | Gnade |
| 5,801,092 A | 9/1998 | Ayers |
| 5,851,503 A | 12/1998 | Mitani et al. |
| 5,885,843 A | 3/1999 | Ayers |

(Continued)

FOREIGN PATENT DOCUMENTS

EP 0 647 606 A1 4/1995

(Continued)

OTHER PUBLICATIONS

Chen, K., et al., "Fullerene Self-Assembly onto $(MeO)_3Si(CH_2)_3NH_2$-Modified Oxide Surfaces," *J. Am. Chem. Soc.* 115:1193-1194, American Chemical Society (1993).

(Continued)

*Primary Examiner*—William Phillip Fletcher, III
(74) *Attorney, Agent, or Firm*—Sterne Kessler Goldstein & Fox P.L.L.C.

(57) ABSTRACT

This invention provides a process for making a polyfunctional starburst-shaped fullerene derivative for use as a matrix-reinforcing agent for mesoporous and other porous materials. This invention can include the formation of a highly soluble example of such a derivative from a fullerene and a bifunctional coupling agent. A solution of said matrix-reinforcing agent can be prepared and then applied to a material while the material is still in a process of formation, or the agent can be applied to an already formed solid material. Porous films and bodies containing such a matrix-reinforcing agent can exhibit improved mechanical properties, and can be produced using equipment and techniques common and available to those skilled in the art of porous materials preparations.

31 Claims, 3 Drawing Sheets

U.S. PATENT DOCUMENTS

| | | | |
|---|---|---|---|
| 5,965,202 | A | 10/1999 | Taylor-Smith et al. |
| 6,066,272 | A | 5/2000 | Tang et al. |
| 6,083,624 | A | 7/2000 | Hiura |
| 6,113,673 | A | 9/2000 | Loutfy et al. |
| 6,187,427 | B1 | 2/2001 | Taylor-Smith et al. |
| 6,214,746 | B1 | 4/2001 | Leung et al. |
| 6,255,241 | B1 | 7/2001 | Miyazawa et al. |
| 6,277,766 | B1 | 8/2001 | Ayers |
| 6,287,979 | B1 | 9/2001 | Zhou et al. |
| 6,329,748 | B1 | 12/2001 | Kastalsky |
| 6,368,569 | B1 | 4/2002 | Haddon et al. |
| 6,380,270 | B1 | 4/2002 | Yates |
| 6,423,811 | B1 | 7/2002 | Lau et al. |
| 6,536,604 | B1 | 3/2003 | Brinker |
| 6,599,492 | B2 | 7/2003 | Iwamura et al. |
| 6,713,590 | B2 | 3/2004 | Lau et al. |
| 6,743,481 | B2 | 6/2004 | Hoehn et al. |
| 6,790,790 | B1 | 9/2004 | Lyons et al. |
| 6,797,777 | B2 | 9/2004 | Lau et al. |
| 6,855,202 | B2 | 2/2005 | Alivisatos et al. |
| 6,967,222 | B2 | 11/2005 | Khanarian et al. |
| 6,984,265 | B1 | 1/2006 | Raguse et al. |
| 6,987,147 | B2 | 1/2006 | Lau et al. |
| 6,998,178 | B2 | 2/2006 | Apen et al. |
| 7,011,890 | B2 | 3/2006 | Nguyen et al. |
| 7,014,681 | B2 | 3/2006 | Noack et al. |
| 7,060,204 | B2 | 6/2006 | Li et al. |
| 2001/0016608 | A1 | 8/2001 | Haddon et al. |
| 2001/0041801 | A1 | 11/2001 | Friedman et al. |
| 2002/0016414 | A1 | 2/2002 | Lau et al. |
| 2002/0037941 | A1 | 3/2002 | Lau et al. |
| 2002/0061397 | A1 | 5/2002 | Iwamura et al. |
| 2003/0072947 | A1 | 4/2003 | Lee et al. |
| 2003/0151031 | A1 | 8/2003 | Li et al. |
| 2003/0162002 | A1 | 8/2003 | Lau et al. |
| 2003/0187139 | A1 | 10/2003 | Lau et al. |
| 2003/0213958 | A1 | 11/2003 | Nakagawa et al. |
| 2004/0005506 | A1 | 1/2004 | Nishimura |
| 2004/0038408 | A1 | 2/2004 | Abbott et al. |
| 2004/0046155 | A1 | 3/2004 | Li et al. |
| 2004/0096672 | A1 * | 5/2004 | Lukas et al. ............... 428/446 |
| 2004/0102584 | A1 | 5/2004 | Lau et al. |
| 2004/0121501 | A1 | 6/2004 | Large et al. |
| 2004/0132846 | A1 | 7/2004 | Leventis et al. |
| 2004/0175568 | A1 | 9/2004 | Takaguchi |
| 2004/0175581 | A1 | 9/2004 | Nguyen et al. |
| 2004/0180201 | A1 | 9/2004 | Veedu et al. |
| 2004/0185448 | A1 | 9/2004 | Lopez-Avila |
| 2004/0250750 | A1 | 12/2004 | Reda et al. |
| 2005/0020702 | A1 | 1/2005 | Li et al. |
| 2005/0089684 | A1 | 4/2005 | Barron et al. |
| 2005/0119360 | A1 | 6/2005 | Kawakami et al. |
| 2005/0238889 | A1 | 10/2005 | Iwamoto et al. |
| 2005/0263908 | A1 | 12/2005 | Nakagawa et al. |
| 2005/0279399 | A1 | 12/2005 | Gaudiana et al. |
| 2006/0002875 | A1 | 1/2006 | Winkler et al. |
| 2006/0024502 | A1 | 2/2006 | McFarland et al. |
| 2006/0071300 | A1 | 4/2006 | Haverty et al. |
| 2006/0093885 | A1 | 5/2006 | Krusic et al. |
| 2006/0106152 | A1 | 5/2006 | Metzinger et al. |

FOREIGN PATENT DOCUMENTS

| | | |
|---|---|---|
| EP | 1 015 384 B1 | 7/2000 |
| EP | 1 063 197 A2 | 12/2000 |
| EP | 1 190 422 B1 | 3/2002 |
| EP | 1 244 731 B1 | 10/2002 |
| EP | 1 265 080 A2 | 12/2002 |
| EP | 1 473 770 A1 | 11/2004 |
| GB | 2 380 496 A | 4/2003 |
| JP | 5-254955 A | 10/1993 |
| JP | 6-324681 A | 11/1994 |
| JP | 8-181133 A | 7/1996 |
| JP | 8-245209 A | 9/1996 |
| JP | 9-316202 A | 12/1997 |
| JP | 10-310709 A | 11/1998 |
| JP | 11-263916 A | 9/1999 |
| JP | 2000-154191 A | 6/2000 |
| JP | 2000-268632 A | 9/2000 |
| JP | 2001-192322 A | 7/2001 |
| JP | 2002-6478 A | 1/2002 |
| JP | 2002-72964 A | 3/2002 |
| JP | 2003-3047 A | 1/2003 |
| JP | 2003-3119 A | 1/2003 |
| JP | 2003-176113 A | 6/2003 |
| JP | 2003-280249 A | 10/2003 |
| JP | 2003-321214 A | 11/2003 |
| JP | 2004-182771 A | 7/2004 |
| JP | 2005-53832 A | 3/2005 |
| JP | 2005-105152 A | 4/2005 |
| JP | 2005-119167 A | 5/2005 |
| JP | 2005-144601 A | 6/2005 |
| JP | 2005-263509 A | 9/2005 |
| JP | 2005-268550 A | 9/2005 |
| JP | 2005-272639 A | 10/2005 |
| JP | 2005-289755 A | 10/2005 |
| JP | 2005-290316 A | 10/2005 |
| WO | WO 98/07793 A1 | 2/1998 |
| WO | WO 00/68956 A1 | 11/2000 |
| WO | WO 01/25316 A1 | 4/2001 |
| WO | WO 01/78110 A2 | 10/2001 |
| WO | WO 01/91922 A2 | 12/2001 |
| WO | WO 02/06366 A1 | 1/2002 |
| WO | WO 02/30814 A1 | 4/2002 |
| WO | WO 02/081546 A1 | 10/2002 |
| WO | WO 03/018645 A1 | 3/2003 |
| WO | WO 03/057749 A1 | 7/2003 |
| WO | WO 03/060979 A2 | 7/2003 |
| WO | WO 03/061029 A2 | 7/2003 |
| WO | WO 2004/000909 A1 | 12/2003 |
| WO | WO 2004/079814 A2 | 9/2004 |
| WO | WO 2005/008761 A1 | 1/2005 |
| WO | WO 2005/010071 A1 | 2/2005 |
| WO | WO 2005/028174 A2 | 3/2005 |
| WO | WO 2006/023921 A2 | 3/2006 |
| WO | WO 2006/028704 A2 | 3/2006 |
| WO | WO 2006/028776 A1 | 3/2006 |

OTHER PUBLICATIONS

Hirsch, A., et al., "Globe-trotting Hydrogens on the Surface of the Fullerene Compound $C_{60}H_6(N(CH_2CH_2)_2O)_6$," *Angew. Chem. Int. Ed. Engl.* 30:1309-1310, VCH Verlagsgesellschaft mbH (1991).

Hirsch, A., et al., "Regioselective Multiple Additions to Buckminsterfullerene," in *The Chemical Physics of Fullerenes 10 (and 5) Years Later*, Andreoni, W., ed., Kluwer Academic Publishers, Boston, MA, pp. 267-283 (1996).

Jenekhe, S.A., and Chen, X.L., "Self-Assembly of Ordered Microporous Materials from Rod-Coil Block Copolymers," *Science* 283:372-375, American Association for the Advancement of Science (1999).

Liang, C., et al., "Synthesis of a Large-Scale Highly Ordered Porous Carbon Film by Self-Assembly of Block Copolymers," *Angew. Chem. Int. Ed.* 43:5785-5789, Wiley-VCH Verlag GmbH & Co. KGaA (Nov. 2004).

Maggini, M., et al., "$C_{60}$ Derivatives Embedded in Sol-Gel Silica Films," *Adv. Mater.* 7:404-406, VCH Verlagsgesellschaft mbH (1995).

Ouyang, J., et al., "Structures and Properties of Supramolecular Assembled Fullerenol/Poly(dimethylsiloxane) Nanocomposites," *J. Phys. Chem. B* 108:5937-5943, American Chemical Society (May 2004).

Wudl, F., et al., "Survey of Chemical Reactivity of $C_{60}$, Electrophile and Dienopolarophile Par Excellence," in *ACS Symposium*

*Series—Fullerenes*, Hammond, G.S., and Kuck, V.J., eds., American Chemical Society, Washington, DC, pp. 161-175 (1992).

Yevlampieva, N., et al., "Star-like Fullerene Containing Poly(Vinylpyrrolydone) Derivatives: Chloroform Solution Properties," *Fullerenes, Nanotubes, and Carbon Nanostructures* 12:353-359, Marcel Dekker, Inc. (Aug. 2004).

Patent Abstracts of Japan, unverified English language abstract for JP 5-254955 A (Document FP1 listed on accompanying PTO/SB/08A).

Patent Abstracts of Japan, unverified English language abstract for JP 6-324681 A (Document FP2 listed on accompanying PTO/SB/08A).

Patent Abstracts of Japan, unverified English language abstract for JP 8-181133 A (Document FP4 listed on accompanying PTO/SB/08A).

Patent Abstracts of Japan, unverified English language abstract for JP 8-245209 A (Document FP5 listed on accompanying PTO/SB/08A).

Patent Abstracts of Japan, unverified English language abstract for JP 9-316202 A (Document FP6 listed on accompanying PTO/SB/08A).

Patent Abstracts of Japan, unverified English language abstract for JP 11-0263916 A (Document FP7 listed on accompanying PTO/SB/08A).

Patent Abstracts of Japan, unverified English language abstract for JP 10-310709 A (Document FP8 listed on accompanying PTO/SB/08A).

Patent Abstracts of Japan, unverified English language abstract for JP 2000-154191 A (Document FP10 listed on accompanying PTO/SB/08A).

Patent Abstracts of Japan, unverified English language abstract for JP 2000-268632 A (Document FP11 listed on accompanying PTO/SB/08A).

Patent Abstracts of Japan, unverified English language abstract for JP 2001-192322 A (Document FP15 listed on accompanying PTO/SB/08A).

Patent Abstracts of Japan, unverified English language abstract for JP 2002-6478 A (Document FP18 listed on accompanying PTO/SB/08A).

Patent Abstracts of Japan, unverified English language abstract for JP 2002-72964 A (Document FP19 listed on accompanying PTO/SB/08A).

Patent Abstracts of Japan, unverified English language abstract for JP 2003-3047 A (Document FP26 listed on accompanying PTO/SB/08A).

Patent Abstracts of Japan, unverified English language abstract for JP 2003-3119 A (Document FP27 listed on accompanying PTO/SB/08A).

Patent Abstracts of Japan, unverified English language abstract for JP 2003-176113 A (Document FP30 listed on accompanying PTO/SB/08A).

Patent Abstracts of Japan, unverified English language abstract for JP 2003-280249 A (Document FP34 listed on accompanying PTO/SB/08A).

Patent Abstracts of Japan, unverified English language abstract for JP 2003-321214 A (Document FP36 listed on accompanying PTO/SB/08A).

Patent Abstracts of Japan, unverified English language abstract for JP 2004-182771 A (Document FP37 listed on accompanying PTO/SB/08A).

Patent Abstracts of Japan, unverified English language abstract for JP 2005-53832 A (Document FP42 listed on accompanying PTO/SB/08A).

Patent Abstracts of Japan, unverified English language abstract for JP 2005-105152 A (Document FP44 listed on accompanying PTO/SB/08A).

Patent Abstracts of Japan, unverified English language abstract for JP 2005-119167 A (Document FP45 listed on accompanying PTO/SB/08A).

Patent Abstracts of Japan, unverified English language abstract for JP 2005-144601 A (Document FP46 listed on accompanying PTO/SB/08A).

Patent Abstracts of Japan, unverified English language abstract for JP 2005-263509 A (Document FP47 listed on accompanying PTO/SB/08A).

Patent Abstracts of Japan, unverified English language abstract for JP 2005-268550 A (Document FP48 listed on accompanying PTO/SB/08A).

Patent Abstracts of Japan, unverified English language abstract for JP 2005-272639 A (Document FP49 listed on accompanying PTO/SB/08A).

Patent Abstracts of Japan, unverified English language abstract for JP 2005-289755 A (Document FP50 listed on accompanying PTO/SB/08A).

Patent Abstracts of Japan, unverified English language abstract for JP 2005-290316 A (Document FP51 listed on accompanying PTO/SB/08A).

Dialog File 351, Accession No. 7111280, unverified English language abstract for EP 0 647 606 A1 (Document FP3 listed on accompanying PTO/SB/08A).

Jena, P., and Khanna, S.N., "Physics of cluster assembled materials," *Mater. Sci. Eng. A217/A218*:218-222, Elsevier Science S.A. (1996).

Matsuura, M., et al., "On the role of small additives for nanocrystalline formation from amorphous matrix," *Mater. Sci. Eng. A217/A218*:397-400, Elsevier Science S.A. (1996).

Ohno, K., et al., "Ab-initio molecular dynamics study of the stability and reactivity of $C_{60}$," *Mater. Sci. Eng. A217/A218*:19-22, Elsevier Science S.A. (1996).

Co-pending U.S. Appl. No. 11/806,464, inventor Ayers, M.R., filed May 31, 2007 (Not Published).

Co-pending U.S. Appl. No. 11/806,463, inventor Ayers, M.R., filed May 31, 2007 (Not Published).

Co-pending U.S. Appl. No. 11/806,482, inventor Ayers, M.R., filed May 31, 2007 (Not Published).

Co-pending U.S. Appl. No. 11/806,465, inventor Ayers, M.R., filed May 31, 2007 (Not Published).

International Search Report completed for Application No. PCT/US07/12836 on Sep. 20, 2007 and mailed on Nov. 5, 2007.

International Search Report completed for Application No. PCT/US07/12835 on Oct. 3, 2007 and mailed on Nov. 28, 2007.

International Search Report completed for Application No. PCT/US07/12831 on Oct. 19, 2007 and mailed on Dec. 5, 2007.

International Search Report completed for Application No. PCT/US07/12832 on Oct. 24, 2007 and mailed on Dec. 18, 2007.

* cited by examiner

POROUS FILMS AND BODIES WITH ENHANCED MECHANICAL STRENGTH

BACKGROUND

This disclosure relates generally to porous materials, and more particularly to producing oxides and other porous or partly-porous compositions and structures having enhanced mechanical strength.

Porous materials with feature sizes expressible roughly in terms of nanometers or smaller comprise an important class of materials useful in an ever-increasing range of applications. Chief among these applications are membranes (U.S. Pat. No. 6,536,604, Brinker, et al.), sensors (U.S. Pat. No. 5,885,843, Ayers and Hunt), display devices (U.S. Pat. No. 6,329,748, Kastalsky, et al.), and, notably, microelectronic devices, where such materials show promise as low dielectric constant materials (U.S. Pat. No. 5,789,819, Gnade, et al.). However, many seemingly useful materials do not exhibit the necessary mechanical strength required by the aforementioned applications. This results from the fact that many desirable properties, such as high permeability or low dielectric constant are maximized only when the material possesses a relatively high void fraction, or porosity. High porosity generally leads to lower-strength materials, relative to fully dense materials of similar compositions, and typically precludes the use of such materials in practice. Increasing the mechanical strength of porous materials is most easily accomplished by simply lowering their porosity. However, this often counteracts many of the beneficial properties of higher porosity analogs. Therefore there is an important need for materials with a favorable combination of relatively high porosity and good mechanical properties.

Common terms used in the art, and also used herein, to describe the microstructure of porous materials are microporous, referring to a material possessing pores between 0.3 and 1.0 nm in diameter, mesoporous, for pores between 1.0 and 50 nm, and macroporous for pores greater than 50 nm. Porosity refers to the volume fraction of the material occupied by a fluid or gaseous phase, and is commonly reported as a percentage of the total volume.

Many commonly occurring mesoporous materials exhibit a microstructure formed by the linking of small (1-10 nm diameter) particles into a three-dimensional network spatially conterminous with an interconnecting open-pore network. Such structures are commonly formed by sol-gel processing, a technique well-known to those skilled in the art. The particles mentioned above may occur in a wide variety of shapes, including spheres, rods, platelets, polygons, as well as irregular shapes. The points of contact between these particles result in material deficiencies that lead to weaknesses in their bulk structures.

There exist few methods which are effective in strengthening the solid network of a mesoporous material without adversely affecting its desirable properties. One such method is Ostwald ripening. See Brinker and Scherer, Sol-Gel Science: The Physics and Chemistry of Sol-Gel Processing, Academic Press, Chapter 3.3 (1989). In that process, within certain pH ranges, material is dissolved from solid surfaces with a positive (concave) radius of curvature into the surrounding pore fluid, and redeposited on surfaces with a negative (convex) radius of curvature. However, this process is slow. Additionally, as the material which serves to reinforce weak points in the network must be obtained at the sacrifice of other parts of the same network, there is a finite amount of strength improvements that may be obtained in this way.

Another approach has been demonstrated by Haereid, et al. (Journal of Non-Crystalline Solids, vol. 186, pages 96-103 [1995]). Haereid, et al. strengthened a wet silica gel by reinforcement of the solid network using a similar alkoxide precursor to that which formed the original gel. Although this approach may toughen the solid network, it does so by decreasing the porosity of the material significantly. This may have undesired side effects, such as where decreasing the porosity of a mixture by adding silica would have an undesirable effect on the mixture's overall dielectric constant.

Therefore, there remains a distinct need for materials and procedures capable of significantly enhancing the physical and mechanical properties of porous solid networks without significantly decreasing the material's porosity, or otherwise adversely affecting its desirable properties.

It should be noted that useful materials such as fullerenes have found uses in the general field of porous materials, for example as a sacrificial templating material (U.S. Pat. No. 5,744,399, Rostoker, et al.), or as blocking groups for preventing material shrinkage (U.S. Pat. No. 6,277,766, Ayers). However, such materials have had limited use due to their poor solubility and/or (historical) high cost.

SUMMARY

In one aspect of the present disclosure, a polyfunctional, starburst-shaped molecule is synthesized which serves as a matrix-reinforcing agent for any of several compositions of inorganic porous materials, e.g. silica and/or other inorganic oxides. The matrix-reinforcing material of the present invention contains a central core comprised of a fullerene, and three or more radial arms distributed symmetrically around the core. The radial arms of this aspect of the present invention are each terminated by a reactive group capable of covalently bonding to the matrix material to be strengthened. These arms serve as coupling and crosslinking agents, and in so doing impart to the matrix material the desired strength improvements.

In another aspect, fullerene derivatives may be produced by a method described below that includes a step of dissolving a fullerene (e.g. $C_{60}$ and $C_{70}$) into one or more organic solvents such as an alkane, a ketone, an aromatic, or an alcohol.

In another aspect, the above-mentioned matrix-reinforcing material is combined with the matrix material of a sol-gel process while the latter's three-dimensional solid network is still in a process of formation. This allows the matrix-reinforcing material to localize at the contact points of the coalescing particles, thereby imparting a very large strength enhancement for a given amount of material.

In further aspect, the terminal reactive groups of the matrix-reinforcing material are selected such that the rate of reaction at that site is substantially less than the similar reactions in process at the surface of the solid matrix. This aids in the preferred localization of the matrix-reinforcing material at the primary particle contact points.

In a further aspect, the matrix-reinforcing material is added to the solid matrix after the formation of said matrix has been completed. This is accomplished by contacting a solution of the matrix-reinforcing material with a fluid-filled matrix material and allowing the infiltration of the matrix-reinforcing material into the pore fluid of the matrix material. The matrix-reinforcing material is thereby deposited onto a majority of the exposed solid surface of the matrix material. This is especially desirable if a chemical modification of the solid surface is sought in addition to mechanical enhancement. The porous films and/or bodies so prepared can be dried using methods common in the art, and thermally treated to complete the bonding of the matrix-reinforcing material to the solid surface of the matrix, as well as to affect the crosslinking of adjacent matrix-reinforcing molecules.

Further features and benefits of various aspects and embodiments of the present invention will become apparent in light of the following drawings and their accompanying detailed description.

BRIEF DESCRIPTIONS OF THE DRAWINGS

The invention is to be explained in more detail below based on aspects depicted in the following figures where:

Figure 3:
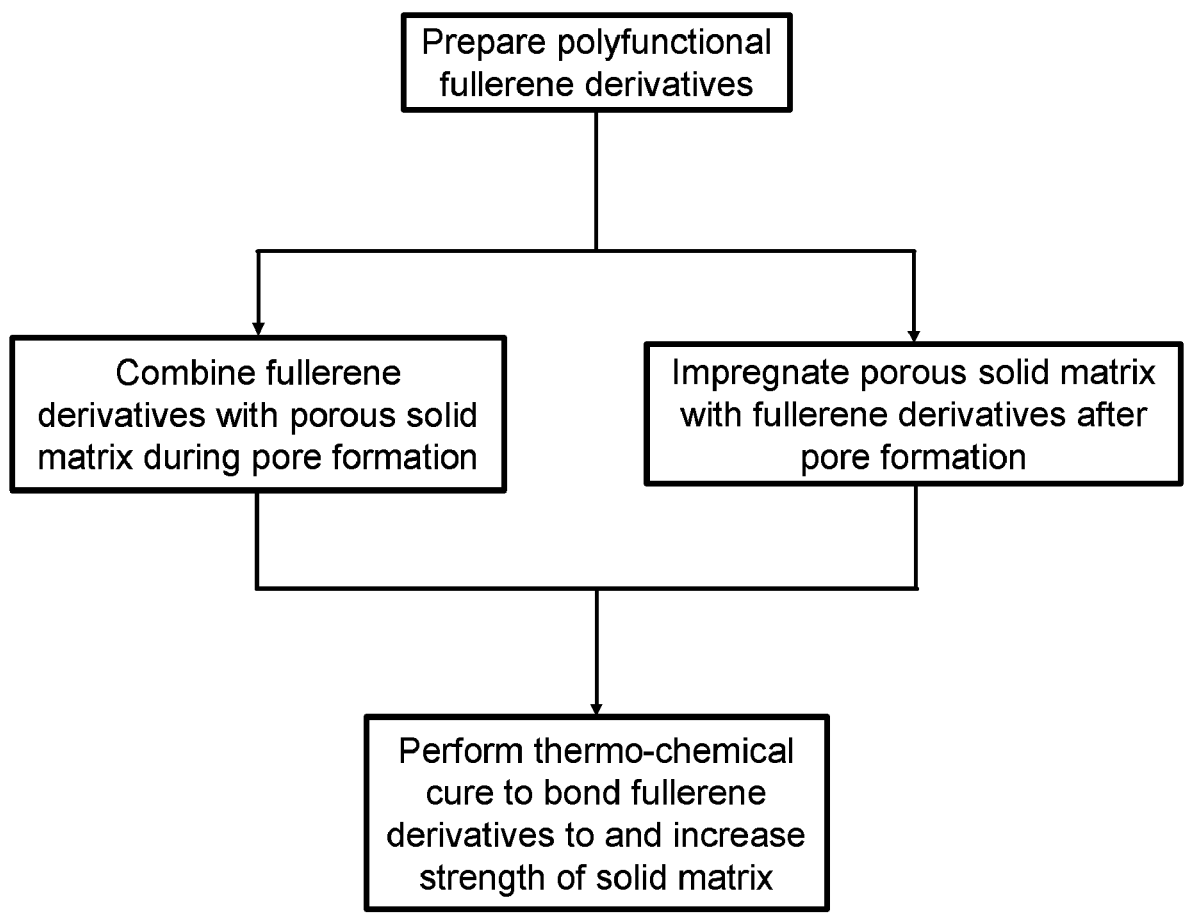

FIG. 3 gives a schematic representation of the process steps involved in the methods of the present disclosure.

DETAILED DESCRIPTION

A matrix-reinforcing material of the present invention is well-suited for enhancing the physical and mechanical properties of mesoporous materials. In one embodiment, a material or structure of the present invention comprises a central fullerene core symmetrically derivatized by three or more bifunctional coupling agents; the molecules prepared in this way possessing the ability to bind to the surface of a desired porous inorganic or oxide material, the ability to crosslink with one another, and excellent thermal stability. The matrix-reinforcing molecules prepared according to the present invention are of a size that allows them to fill the smallest pores and voids of a typical mesoporous material. The present disclosure also teaches method embodiments suitable for delivering said matrix-reinforcing molecules to the desired portions of a porous solid network, depositing them there, and performing a final curing step to increase the mechanical properties of said porous solid. Any preparative route that produces a polyfunctional fullerene derivative, where the fullerene is symmetrically surrounded by multiple arms each terminated by a reactive group may be used, however the preferred method involves the use of a bifunctional coupling agent to form the arms that contains, at one end an amine group and at the opposite and a metal or metalloid alkoxide. However, any coupling agent which is capable of reacting with both a fullerene and the surface of the porous solid may be used.

According to another embodiment, the fullerene core of the matrix-reinforcing molecules primarily include one or more of the following: $C_{60}$, $C_{70}$, $C_{72}$, $C_{74}$, $C_{76}$, $C_{78}$, $C_{84}$, $C_{96}$, and higher analogues up to, and beyond, $C_{184}$ or mixtures thereof. Commercially available mixtures of $C_{60}$ and $C_{70}$, commonly know as Fullerite, fullerene extract, or fullerene soot may also be employed in various embodiments of the present invention.

Many possible compounds that are well-suited to form the reactive arms of the matrix-reinforcing molecules are readily available. Preferred compounds and structures of the present invention generally include three primary components: a terminal group that reacts with fullerenes, a linear organic spacer, and an opposing terminal group capable of reacting with the surface of the desired porous solid. The number of arms in each matrix-reinforcing molecule may vary. In preferred embodiments, there may be about 4-7 (e.g., 6) arms per core.

The terminal group, configured to couple the arms to the fullerene core, can include a primary or secondary amine. Amines are known to those skilled in the art to react with fullerenes in a facile manner. Generally this occurs by a nucleophilic addition reaction across one of the many delocalized bonds of the fullerene cage. Anywhere from one to twelve amine molecules may be added to a single $C_{60}$ molecule, the actual number depending largely on their stearic bulk, with the most common number of additions being six. Other reactive groups, especially other nucleophiles, may be used in addition. These optionally include mixtures containing azides, dienes, and/or carbanions. However, any reactive group which may be found to react effectively with fullerenes may be employed according to the present invention.

The organic-spacer portion of the coupling agent may contain an alkyl chain, a polyether chain, a polyunsaturated alkyl chain, and/or an amine-containing alkyl chain. The chain length of the spacer will be determined in part by the desired mechanical properties of the final, reinforced porous material. Shorter chain lengths, for example 3 or 4 carbon units long, will provide greater rigidity, while longer chains of 10-20 carbon units will result in greater flexibility. In the preferred aspect of the present invention said organic spacer is an alkyl chain 3-20 carbon units long, or more preferably 3-7 carbon units long. However, when greater rigidity is desirable, said alkyl chain may include one or more heteroatomic groups, such as ether groups or amino groups, or one or more rigid components, including, but not limited to, alkynyl-segments, aryl-segments, or other cyclic segments.

The coupling agent is used for binding the matrix-reinforcing material to the solid surface of the porous material. This may be comprised of any of several common functionalities, however as porous inorganic oxides comprise the most common class of porous material currently used in practice, the preferred terminal group according to the present invention is a metal- or metalloid-alkoxide. Alkoxides are known in the art to react upon hydrolysis with the chemically similar surfaces of solid oxides. Any one of numerous possible alkoxide groups may be used according to the present invention, including, not limited to, —Si(OR)$_3$, —Ge(OR)$_3$—Ti(OR)$_3$, —Zr(OR)$_3$, —Sn(OR)$_3$, —Al(OR)$_2$, —B(OR)$_2$. However, as silica is the most common porous oxide in use today, the preferred composition of the terminal group is —Si(OR)$_3$.

The following are non-limiting examples of suitable, commercially available coupling agents useful in many embodiments of the present invention: 3-aminopropyltrimethoxysilane, 3-aminopropyltriethoxysilane, 2-aminoethyl-3-aminopropyltrimethoxysilane, 2-aminoethyl-3-aminopropyltriethoxysilane, diethylenetriaminopropyltrimethoxysilane, hexanediaminomethyltriethoxysilane, 11-aminoundecyltriethoxysilane. However, it will be understood that many additional compounds may be used in accord with the processes of the present invention.

Figure 1:
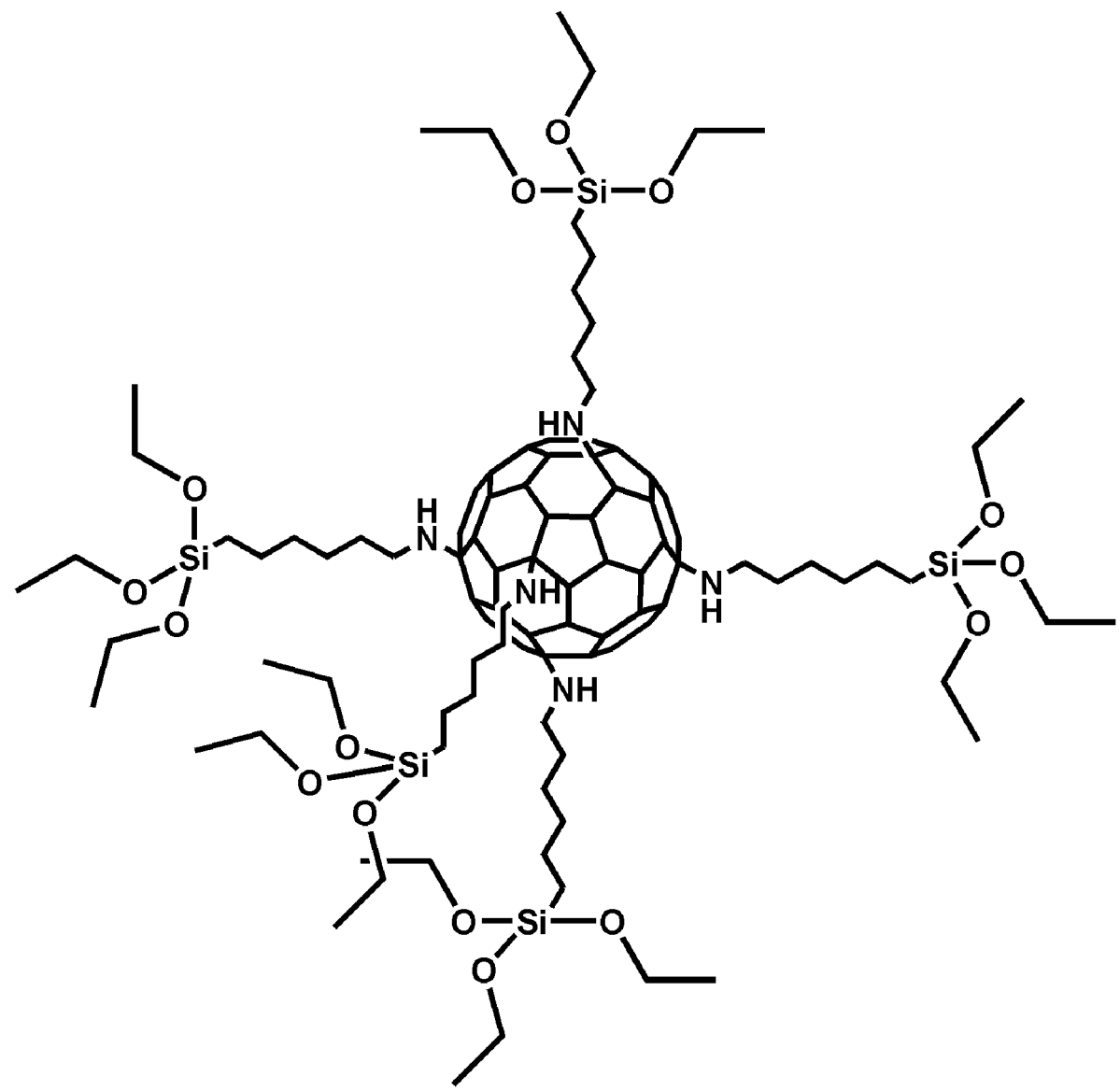
FIG. 1 shows a portion of a matrix-reinforcing molecule of the present disclosure.

A matrix-reinforcing material can be prepared by combining a desired amount of the selected fullerene core with a large excess (i.e. several times larger, by weight) of a selected coupling agent. Initially, in some embodiments, the fullerene is substantially insoluble in the coupling agent and is present as a fine black suspension. Reaction of the amine group of the coupling agent with the fullerene occurs readily at ambient temperature; however, heating the mixture to 50-60° C. or hotter allows the reaction to proceed at a more desirable rate. As the reaction proceeds, the partially derivatized fullerenes exhibit increased solubility in the coupling agent and the mixture exists as a dark brown solution. After approximately 18 hours, the formation of the starburst-shaped matrix-reinforcing compound is complete and in most instances with a maximum number of coupling agents, typically about six, being added to the fullerene core. A large portion of an unreacted coupling agent is removed using vacuum-distillation and is recovered for use in future preparations. This leaves a deep brown-black residue containing the matrix-reinforcing compound. An example of such a compound, derived from $C_{60}$ and 6-aminohexyltriethoxysilane is shown in FIG. 1

An advantageous aspect of some embodiments of the present invention is that the matrix-reinforcing material, prepared as above, possesses a high solubility in many common organic solvents, including alkanes, toluene, benzene, ketones, and alcohols. The latter are especially useful in the present invention as alcohols such as ethanol and 2-propanol are common solvents employed in the sol-gel syntheses of porous oxides from alkoxide, or other, precursors. Consequently the solid residue containing the matrix-reinforcing compound is dissolved in ethanol, or another solvent for application to the porous solid matrix.

Optionally a coupling agent can be used that is not a liquid at ambient temperatures and/or steps and components are selected so that a predetermined non-maximal number of coupling agents are added to each fullerene core in a given structure that embodies the present invention. A coupling agent is selected that has a much higher solubility than a selected fullerene. The solvent is preferably chosen so that it has good solvating ability towards fullerenes. A preferred solvent according to the present invention is toluene, however, other solvents, including, but not limited to, xylenes, carbon disulfide, 1,2-dichlorobenzene, 1-methylnapthalene, or 1-chloronapthalene may be employed. To a solution of fullerene in the selected solvent is added the amount of coupling agent corresponding to the number of arms desired on the matrix-reinforcing compound. The mixture is desirably held at elevated temperatures for at least about 24 hours, after which the solvent is removed from the dark red-brown solution. As above the residue is redissolved in a solvent suitable for application to the porous solid matrix, such as ethanol.

The porous solid matrix to be strengthened may consist of any of the many inorganic compositions known to form mesoporous networks. Common examples include, but are not limited to, $SiO_2$, $TiO_2$, $ZrO_2$, $Al_2O_3$, $SnO_2$, $GeO_2$, $Y_2O_3$, and mixed oxides such as $SiO_2$.$TiO_2$, and $SiO_2$.$Al_2O_3$. Non-oxide solids may also be used with the present invention provided they possess a suitable structure. Preferably such solids are selected so that they have an accessible mesoporous surface with a degree of reactivity with one or more of the primary components described herein that is at least as large as that of $SiO_2$.

The above-described solution of the matrix-reinforcing compound is added to the solution which will form the solid oxide network at a point in time when the primary particles have reached their expected size and begun to link together, but have not yet completed the formation of a three-dimensional porous network, the latter time commonly referred to in the art as the gel point. This allows the matrix-reinforcing compound to mix well with the porous solid precursor solution, but not to interfere with the formation of the primary particles. When a molecular alkoxide is used as the precursor to the porous solid matrix, the appropriate time to add the solution of the matrix-reinforcing compound to the porous solid precursor solution is approximately 60-80% of the gel time. This quantity varies for each specific precursor solution, but is a quantity easily determined by those skilled in the art.

When precursors are used which already possess well-formed primary particles, such as partially-hydrolyzed alkoxides, or colloidal sols, the matrix-reinforcing compound solution may be added to the porous solid precursor solution at the beginning of the sol-gel process.

When forming the matrix reinforcing compound, the molar ratio of the core material and the arm forming material may correspond to the number of arms per core desired. For example, if about six arms per core are desired, then the starting materials for the arms and the core may be adjusted to be in about a six to one molar ratio. In some embodiments, the molar ratio of the arm forming material to the core forming material may be from about 4 to 1 to about 7 to 1.

Figure 2A:
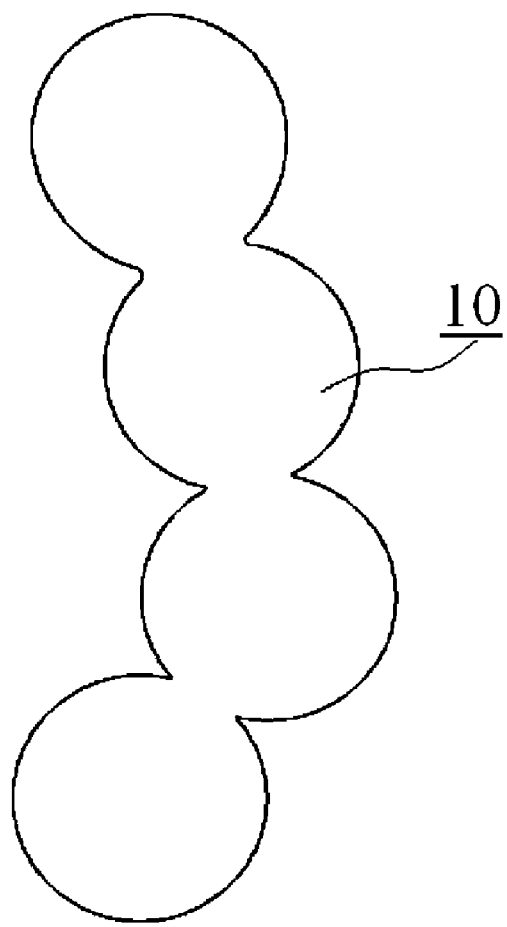
FIGS. 2A-2B shows a representation of the shapes and relative scales of linked, 6-nm diameter solid particles, of a typical porous matrix, as formed by sol-gel processing, and with the addition of a preferred amount of the matrix-reinforcing molecules.
Figure 2B:
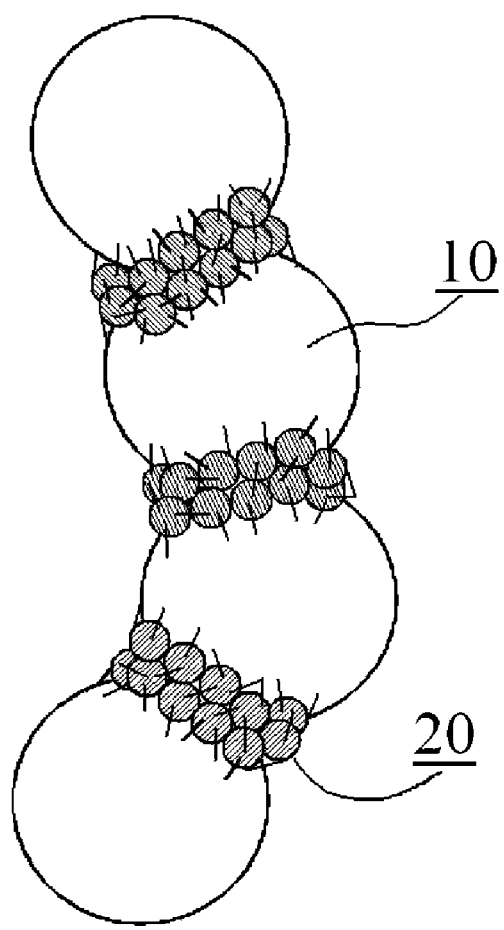

The amount of matrix-reinforcing compound required depends on the degree of surface coverage desired. When the aim is to only add reinforcement to the necks between adjacent particles approximately 5-10% of the total exposed surface needs to be covered. For a typical mesoporous silica material, with a specific surface area of ~800 $m^2$/g, and a matrix-reinforcing compound of the type shown in FIG. 1, approximately 80 mg of matrix-reinforcing compound are required for every gram of silica. If higher coverage is desired a correspondingly higher amount of matrix-reinforcing compound is used. A simple chain of solid particles, 10, from a portion of an untreated porous network is represented in FIG. 2A, while the effect of adding the matrix-reinforcing compound, 20, is shown in FIG. 2B. The arms of the matrix-reinforcing compound are shown as solid lines and bind the molecules to the solid surface, 10, and to adjacent molecules, significantly strengthening the structure. In some embodiments, the weight percent of the matrix reinforcing material to the porous material may be from about 3-30%.

Embodiments of the present invention preferably cause reactions to be completed more rapidly than Ostwald ripening processes, i.e. more rapidly than 4 to 6 days. This is attainable due to the much larger size of the matrix-reinforcing molecules compared to the material normally redissolved by Ostwald ripening, such as silicic acid. Consequently, very few of the matrix-reinforcing molecules need to be transported to areas with negative curvatures in order to fill those areas and provide the desired reinforcement. For that reason, the reinforcement process of the present invention proceeds much more quickly than the standard Ostwald ripening approach.

The reactive groups of the matrix-reinforcing material may be chosen so as to possess a rate of hydrolysis that is notably slower than the hydrolysis reactions the alkoxides which may be used in the formation of the porous solid matrix. This ensures that the matrix-reinforcing molecules are generally not incorporated into the primary skeleton of the porous solid matrix, which would undermine the desired reinforcing effect. The rate of hydrolysis of alkoxides is most easily modified by stearic factors of the group —OR, and by selection of a larger group for R, the rate of hydrolysis may be substantially reduced. An example of the relative rates of hydrolysis for several possible R groups, well known to those skilled in the art, is methyl>ethyl>t-butyl>benzyl. Therefore, in the present invention, if an alkoxide compound such as $Si(OCH_3)_4$ is used to form the porous solid matrix, —Si(O-t-$C_4H_9$)$_3$ may be chosen as the terminal reactive group of the matrix-reinforcing molecules.

The matrix-reinforcing molecules are optionally added to the porous solid matrix after the formation of said matrix has been completed. In certain cases, where the solid matrix is strong enough to withstand rewetting, the matrix-reinforcing molecules may be introduced into a previously-dried porous solid matrix, as a solution in an appropriate solvent. However, such introduction of the matrix-reinforcing molecules is preferably accomplished while the porous solid matrix still contains its original pore fluid. This can be easily accomplished by contacting the fluid-filled porous solid matrix with a solution of the matrix-reinforcing molecules in a compatible solvent. The length of time needed for this process step is proportional to the thickness of the porous film, or the size of the porous body to be reinforced. This process does not possess the level of control of surface coverage shown by the previous aspect of the current invention and is therefore most useful when a high degree of surface coverage is desired. This may be desirable when a modified surface chemistry is desired in addition to mechanical reinforcement.

A method embodiment of the current invention optionally includes a thermal curing step to complete the bonding reactions of the matrix-reinforcing molecules with the solid surface and with adjacent matrix-reinforcing molecules. Before this is performed the porous films or bodies reinforced according to the present invention are dried so as to remove substantially all of the pore fluid contained within. This is accomplished by any of several means such as evaporation, solvent substitution followed by evaporation, supercritical drying, solvent substitution followed by supercritical drying or freeze-drying. Once the reinforced porous material has been completely dried, a final curing step is performed. The parameters of this step are depended on the choice of the terminal reactive group of the matrix-reinforcing molecules. In the case where said group is a silicon alkoxide, or other metal or metalloid alkoxide, the thermal cure serves to remove any residual —OR groups contained in the porous material, thereby enhancing the bonding, and consequently the reinforcing effect, of the matrix-reinforcing molecules with the solid surface and adjacent molecules. In a typical case when a silicon alkoxide is used as the terminal reactive group, the curing step involves heating the porous material, under an atmosphere of moist air, to a temperature above 200° C., but not above 400° C. The methods described in this aspect, and previous aspects of the current invention result in porous films or bodies with significantly enhanced mechanical properties relative to materials with a similar matrix composition and density.

EXAMPLE

The following non-limiting example demonstrates experimental conditions suitable to prepare a porous film and/or body with improved mechanical properties according to the methods described hereinabove.

A mechanically strengthened porous silica material was prepared according to the processes of the present invention. A solution of a polyfunctional starburst-shaped fullerene molecule to be used as a matrix-reinforcing material was prepared as follows. 0.50 grams of $C_{60}$ was mixed with 20 mL of 3-aminopropyltriethoxysilane in a 100-mL schlenk flask. The flask was flushed with dry nitrogen, and the mixture heated to 60° C. for 24 hours. During that time the mixture slowly changed from a clear liquid containing a fine black suspended powder to a dark brown solution with a moderate amount of a thick brown precipitate. The remaining 3-aminopropyltriethoxysilane was removed by vacuum distillation (b.p. 217° C. at 760 mm Hg) This should be accomplished at the lowest possible pressure so that lower distillation temperatures may be employed. After the brown-black residue was dry, a 0.250-gram portion was removed and dissolved in 15 mL of ethanol. This solution was filtered to remove any undissolved material and reserved for use in the next step.

15 mL of prehydrolyzed polyethoxysilane in ethanol (Silbond H-5, Silbond Corp.) was places in a 50 mL beaker and the solution prepared above was added slowly with rapid stirring. Such prehydrolyzed silica solutions typically contain 20-25% silica by weight, and consist of polymers with a length scale of 0.5-5 nm, and typically form fine-structured, but relatively weak, silica gels upon hydrolysis. Shortly after mixing 0.250 mL of water in 5 mL of ethanol was carefully added to the sol. At this point the solution may be applied to a solid substrate by any of several common methods for thin-film application, or poured into a mold for formation of a bulk porous body. In the latter case, the solution typically gelled after a further 30 to 120 seconds. The gel so formed was covered and allowed to set for 18 hours. Subsequently, the hard, rigid, brown-black gel was removed from its mold and placed in a soaking solution of 85% ethanol/15% water which had been brought to a pH of 9.0 with aqueous ammonia, in order to complete the condensation of any remaining polyethoxysilane. After 24 hours the soaking solution was replaced with 200-proof ethanol and the gel was allowed to soak for an additional 18 hours. This step was repeated two more times.

At that point the gel was broken in half and one section allowed to slowly dry at ambient conditions giving a hard, dense xerogel after approximately 24 hours. The other piece was dried using $CO_2$ substitution and supercritical drying according to standard procedures, to yield a dark brown aerogel with a density of ~0.20 g/cm$^3$. Both of these pieces exhibited increased strength in both compression and tension, relative to pure silica gels of similar density and prepared by similar methods. An optional thermal cure at 250° C. for 60 minutes enhanced the strength of the gels still further.

As the fullerene-containing matrix-reinforcing material exhibits an intrinsically lower dielectric constant relative to $SiO_2$, the example presented here is especially useful when a strengthened porous silica film is desired for use as a low dielectric constant material for microelectronics devices. For example, an electronic device may include a dielectric medium formed from a composite according to an embodiment of the invention. The composite may be on a substrate such as a semiconductor substrate. Conductive lines including a material such as copper, aluminum, tungsten, etc. may be on the dielectric medium.

The invention is not to be construed as limited to the particular example described herein, as this is illustrative rather than restrictive. The invention is intended to cover all processes and structures that do not depart from the spirit and scope of the invention.

What is claimed is:

1. A method of reinforcing a sol-gel material the method comprising:
   preparing a reinforcing material including one or more structures, wherein each structure comprises a central core surrounded by one or more reactive arms;
   providing a sol-gel material wherein the sol-gel material is chemically reactive towards the reactive arms;
   applying the reinforcing material to the sol-gel material while a three-dimensional solid network of the gel-sol material is still in a process of formation; and
   bonding the reinforcing material to the sol-gel material.

2. The method of claim 1, wherein said preparing comprises mixing a fullerene with at least one other material.

3. The method of claim 2, wherein the fullerene is selected from the group consisting of $C_{60}$, $C_{70}$, $C_{72}$, $C_{74}$, $C_{76}$, $C_{78}$, $C_{84}$, $C_{96}$, and $C_{184}$.

4. The method of claim 1, wherein the average number of reactive arms of each central core is between 3 and 20.

5. The method of claim 4, wherein the average number of reactive arms of each central core is between 4 and 9.

6. The method of claim 1, wherein the reactive arms of the reinforcing material comprise a first reactive group, a linear organic spacer, and a second reactive group.

7. The method of claim 6, wherein the first reactive group is configured to react with a fullerene.

8. The method of claim 6, wherein the first reactive group is selected from the group consisting of primary amines, secondary amines, dienes, azides, and carbanions.

9. The method of claim 6, wherein the second reactive group is configured to react with a metal- or metalloid-oxide.

10. The method of claim 6, wherein the second reactive group is a metal-alkoxide or metalloid-alkoxide.

11. The method of claim 6, wherein the linear organic spacer is a linear alkane including between about 3 and about 20 carbon atoms.

12. The method of claim 11, wherein the alkane includes one or more internal chain components from the group consisting of ether groups, aryl groups, alkyne groups, alkene groups, amine groups, ketone groups, and cyclic alkane groups.

13. The method of claim 1, wherein the so-gel material, after formation, includes a plurality of pores with diameters between about 1 and about 50 nanometers (nm).

14. The method of claim 1, wherein said applying comprises adding the reinforcing material to the sol-gel prior to a gel point.

15. The method of claim 1, wherein the reinforcing material substantially fills pores of the sol-gel material that exist after formation of the sol-gel material, and wherein the pores have a diameter of less than about 3 nm.

16. The method of claim 1, wherein the reinforcing material covers about 50-100% of the surface of the sol-gel material after its formation.

17. A method of reinforcing a porous sol-gel material, the method comprising:
preparing a reinforcing material including one or more structures, wherein each structure comprises a central core surrounded by one or more reactive arms;
providing a porous sol-gel material wherein a surface of the porous sol-gel material is chemically reactive towards the reactive arms;
applying the reinforcing material to the surface of the porous sol-gel material; and
bonding the reinforcing material to the surface of the porous sol-gel material.

18. The method of claim 17, wherein said preparing comprises mixing a fullerene with at least one other material.

19. The method of claim 18, wherein the fullerene is selected from the group consisting of $C_{60}$, $C_{70}$, $C_{72}$, $C_{74}$, $C_{76}$, $C_{78}$, $C_{84}$, $C_{96}$, and $C_{184}$.

20. The method of claim 17, wherein the average number of reactive arms of each central core is between 3 and 20.

21. The method of claim 20, wherein the average number of reactive arms of each central core is between 4 and 9.

22. The method of claim 17, wherein the reactive arms of the reinforcing material comprise a first reactive group, a linear organic spacer, and a second reactive group.

23. The method of claim 22, wherein the first reactive group is configured to react with a fullerene.

24. The method of claim 22, wherein the first reactive group is selected from the group consisting of primary amines, secondary amines, dienes, azides, and carbanions.

25. The method of claim 22, wherein the second reactive group is configured to react with a metal-oxide or metalloid-oxide.

26. The method of claim 22, wherein the second reactive group is a metal-alkoxide or metalloid-alkoxide.

27. The method of claim 22, wherein the linear organic spacer is a linear alkane including between about 3 and about 20 carbon atoms.

28. The method of claim 27, wherein the alkane includes one or more internal chain components selected from the group consisting of ether groups, aryl groups, alkyne groups, alkene groups, amine groups, ketone groups, and cyclic alkane groups.

29. The method of claim 17, wherein the porous sol-gel material includes a plurality of pores with diameters between about 1 and about 50 nm.

30. The method of claim 17, wherein the reinforcing material substantially fills pores of the porous sol-gel material that have a diameter of less than about 3 nm.

31. The method of claim 17, wherein the reinforcing material covers about 50-100% of the surface of the porous sol-gel material.

* * * * *

UNITED STATES PATENT AND TRADEMARK OFFICE
CERTIFICATE OF CORRECTION

PATENT NO. : 7,531,209 B2  Page 1 of 1
APPLICATION NO. : 10/906534
DATED : May 12, 2009
INVENTOR(S) : Michael Raymond Ayers It is certified that error appears in the above-identified patent and that said Letters Patent is hereby corrected as shown below:

Title Page, Item (76), Inventor section, please replace "Michael Raymond Ayers, 808 Robinson St., Martinez, CA (US) 94553" with --Michael Raymond Ayers, Martinez, CA (US)--.

Column 9, line 21, please replace "wherein the so-gel material" with --wherein the sol-gel material--.

Signed and Sealed this

Fourteenth Day of July, 2009

JOHN DOLL
*Acting Director of the United States Patent and Trademark Office*